United States Patent [19]
Taylor

[11] Patent Number: 5,745,403
[45] Date of Patent: Apr. 28, 1998

[54] SYSTEM AND METHOD FOR MITIGATING IMPRINT EFFECT IN FERROELECTRIC RANDOM ACCESS MEMORIES UTILIZING A COMPLEMENTARY DATA PATH

[75] Inventor: Craig Taylor, Colorado Springs, Colo.

[73] Assignee: Ramtron International Corporation, Colorado Springs, Colo.

[21] Appl. No.: 810,608

[22] Filed: Feb. 28, 1997

[51] Int. Cl.$^6$ ............................................. G11C 7/00
[52] U.S. Cl. .............................. 365/145; 365/200
[58] Field of Search ........................... 365/145, 149, 365/200, 201; 371/21

[56] References Cited

U.S. PATENT DOCUMENTS

| | | | |
|---|---|---|---|
| 4,045,779 | 8/1977 | Markle | 365/200 |
| 4,615,030 | 9/1986 | Kumagai | 371/21 |
| 4,794,597 | 12/1988 | Ooba et al. | 371/3 |
| 5,267,204 | 11/1993 | Ashmore Jr. | 365/200 |

OTHER PUBLICATIONS

"FM24C08 FRAM® Serial Memory Product Preview," ©1994 Ramtron International Corporation, 1850 Ramtron Drive, Colorado Springs CO 80921.

"FM24164 FRAM® Serial Memory Product Preview," ©1994 Ramtron International Corporation, 1850 Ramtron Drive, Colorado Springs CO 80921.

"FM24C168 FRAM® Serial Memory Product Specification," ©1994 Ramtron International Corporation, 1850 Ramtron Drive, Colorado Springs CO 80921, pp. 2–10 through 2–16.

*Primary Examiner*—David C. Nelms
*Assistant Examiner*—Vu A. Le
*Attorney, Agent, or Firm*—William J. Kubida, Esq.; Carol W. Burton, Esq.; Holland & Hart LLP

[57] ABSTRACT

A system and method for mitigating undesired imprint effects in a ferroelectric memory array through the addition of a complementary data path which allows user data to be written to the array in an inverted state and then subsequently read out from the array in a re-inverted state in response to the state of at least one indicator bit corresponding to each row of the array.

32 Claims, 8 Drawing Sheets

SYSTEM AND METHOD FOR MITIGATING IMPRINT EFFECT IN FERROELECTRIC RANDOM ACCESS MEMORIES UTILIZING A COMPLEMENTARY DATA PATH

CROSS REFERENCE TO RELATED PATENT APPLICATIONS

The present invention is related to co-pending U.S. patent application Ser. No. 08/810,607 filed on Feb. 28, 1997 for: "Serial Ferroelectric Random Access Memory Architecture to Equalize Column Accesses and Improve Data Retention Reliability by Mitigating Imprint Effects" assigned to Ramtron International Corporation, Colorado Springs, Colo., assignee of the present invention, the disclosure of which is herein specifically incorporated by this reference.

BACKGROUND OF THE INVENTION

The present invention relates, in general, to the field of non-volatile, ferroelectric memory device integrated circuits. More particularly, the present invention relates to a system and method for mitigating undesired imprint, or compensation, effects in ferroelectric memory arrays through the addition of a complementary data path which allows user data to be written to the array in an inverted state and then subsequently read out from the array in a re-inverted or "true" state.

Ferroelectric memory devices, such as the FRAM® family of solid state, random access memory ("RAM") integrated circuits ("ICs") available from Ramtron International Corporation, Colorado Springs, Colo. provide non-volatile data storage through the use of a ferroelectric dielectric material which may be polarized in one direction or another in order to store a binary value. The ferroelectric effect allows for the retention of a stable polarization in the absence of an applied electric field due to the alignment of internal dipoles within the Perovskite crystals in the dielectric material. This alignment may be selectively achieved by application of an electric field which exceeds the coercive field of the material. Conversely, reversal of the applied field reverses the internal dipoles.

A hysteresis curve, wherein the abscissa and ordinate represent the applied voltage and resulting polarization states respectively, may be plotted to represent the response of the polarization of a ferroelectric capacitor to the applied voltage. A more complete description of this characteristic hysteresis curve is disclosed, for example, in U.S. Pat. Nos. 4,914,627 and 4,888,733 assigned to the assignee of the present invention, the disclosures of which are herein specifically incorporated by this reference.

Data stored in a ferroelectric memory cell is "read" by applying an electric field to the cell capacitor. If the field is applied in a direction to switch the internal dipoles, more charge will be moved than if the dipoles are not reversed. As a result, sense amplifiers can measure the charge applied to the cell bit lines and produce either a logic "1" or "0" at the IC output pins. In a conventional two transistor/two capacitor ("2T/2C") ferroelectric memory cell, a pair of two data storage elements are utilized, each polarized in opposite directions. To "read" the state of a 2T/2C memory cell, both elements are polarized in the same direction and the sense amps measure the difference between the amount of charge transferred from the cells to a pair of complementary bit lines. In either case, since a "read" to a ferroelectric memory is a destructive operation, the correct data is then restored to the cell during a precharge operation.

In a simple "write" operation, an electric field is applied to the cell capacitor to polarize it to the desired state. Briefly, the conventional write mechanism for a 2T/2C memory cell includes inverting the dipoles on one cell capacitor and holding the electrode, or plate, to a positive potential greater than the coercive voltage for a nominal 100 nanosecond ("nsec.") time period. The electrode is then brought back to circuit ground for the other cell capacitor to be written for an additional nominal 100 nsec.

However, ferroelectric capacitors tend to be subject to "imprint". That is, they can become "compensated" wherein the hysteresis loop appears to shift to favor the stored state due to a charge build-up. Such imprint can result in an undesirably low signal level being presented to the sense amps upon the performance of subsequent "read" operations, thereby possibly indicating a device failure during test or providing a potentially erroneous indication of stored data. Because of their tendency to imprint, conventional ferroelectric memory devices may be sometimes viewed as perhaps better suited for use as read only memories ("ROMs") than random access memories ("RAMs"). Nevertheless, in many applications, a ferroelectric memory array either is or can be read quite often so a need exists for dealing with imprint characteristics such that its effects can be either reduced or negated their entirety.

SUMMARY OF THE INVENTION

Disclosed herein is an architecture for use in conjunction with ferroelectric memory devices which allows data to alternately stored as "true" and "complement" each time a row in the memory array is read. This technique mitigates problems associated with ferroelectric capacitor "imprint" or "compensation".

As above-described, current ferroelectric memory devices require a write back following every read cycle and, therefore memory locations that are read often are also written often as well. As previously described, current ferroelectric dielectrics exhibit an undesired tendency to "imprint", that is, new data states tend to revert to the previous state if written often or left to remain in the same state for long periods of time.

Typically, a ferroelectric memory array is arranged in rows and columns. The columns are generally as wide as the data word. If the memory array is organized as byte-wide, then the columns are eight bits wide. For example, the FM24C16 available from Ramtron International Corporation is a 16 Kbit serial memory organized 2K×8. The array has 256 rows and 8 columns with eight bits per column.

A specific embodiment of the system and method of the present invention disclosed herein proposes the incorporation of a latch to such an exemplary device equal to the length of a memory array row with an additional column to store a true/complement bit (or multiple bits) and alternate data paths between the array and the latch. The data is transferred to and from the array via the alternate data paths determined by the state of the true/complement bit in column n+1. The technique disclosed may be utilized with both serial and parallel memory devices.

The device operation begins with either a read or write operation. The write operation may utilize a "write-through" technique (that is, write directly to the array bypassing the latch) or write to the latch and then to the array at the row boundary or write cycle termination (in page mode). Conventional ferroelectric memory device operation is "read-modify-write" for both operations which means that block writes (writes to several rows sequentially) will write back the data to the first column n times more than the last column (that is, column 0 gets one write with new data and n−1 write back cycles while column n gets n−1 write backs with old data and one write with new data). In addition, write-through requires full cycle operation for every byte when writing sequentially and writes via the latch can have fast in-page access. Consequently, in a preferred embodiment, all accesses to the array may be made via the latch.

The access sequence beginning with a write operation will detect the row address and load data into the latch until the row boundary is reached or the write cycle is terminated. The latch is then written to the array as true and the column n+1 bit is set. In the case of block writes, each byte (column) is written once.

Read operations begin with row address detect, the column n+1 bit is read and, if column n+1 is set(1), the true data path is selected. On the other hand, if column n+1 is clear(0), the inverted data path is selected and the latch is loaded. In either event, the data at the output of the device is as written to the user. After the latch is loaded, data is written back to the array inverted and the column n+1 bit is either set or cleared as appropriate. In an alternative embodiment, the n+1 column can be extended to three bits thereby allowing a simple voting scheme to correct single bit errors.

The system and method of the present invention will invert the data in each row if the memory is read periodically. In addition, the data in the row can remain at bias until the row boundary or cycle termination is detected, which can be a significant amount of time especially in serial memories, thereby further tending to mitigate the effects of imprint.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
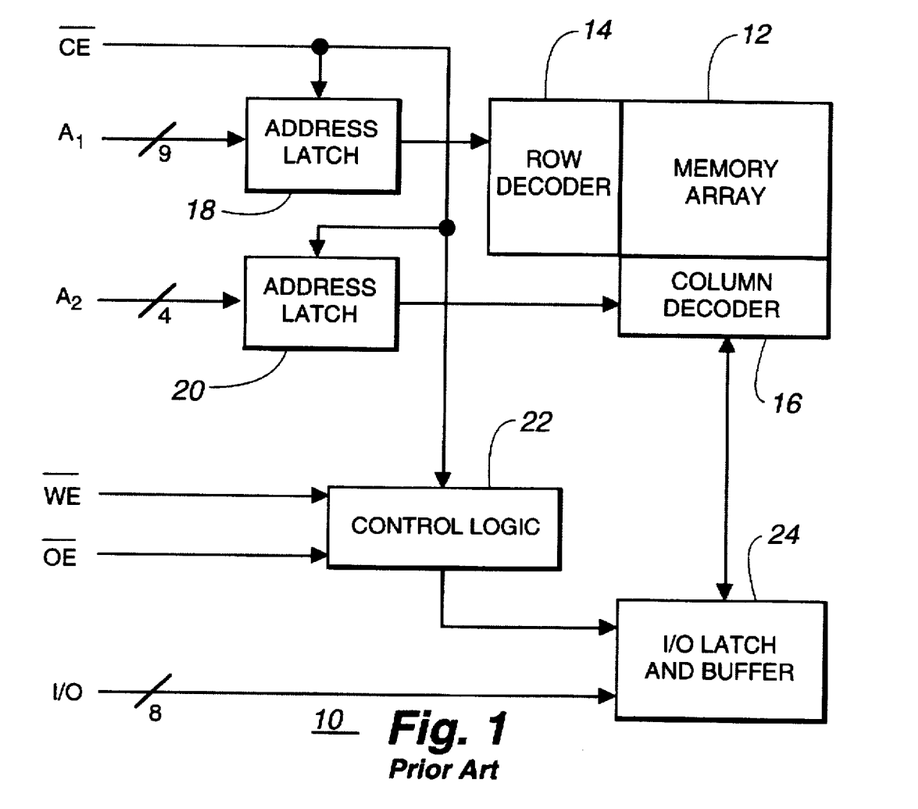
FIG. 1 is a simplified functional block diagram of a conventional parallel ferroelectric memory device, such as the FM1608S, available from Ramtron International Corporation illustrating a 13 bit address bus and a bidirectional 8 bit parallel input/output ("I/O") data bus.

With reference now to FIG. 1, a prior art parallel ferroelectric memory device 10 is shown. The memory device 10 comprises, in pertinent part, a memory array 12 which comprises a number of memory cells which are accessible for both reading data from, and writing data to, the memory array 12 by means of a row decoder 14 and column decoder 16.

The memory cells of the memory array 12 of the memory device 10 are addressable by means of one or more externally accessible address buses coupled to address latches 18, 20, which provide addresses to the corresponding row decoder 14 and to column decoder 16. The address latches 18, 20 are enabled by an active low chip enable ("/CE") signal which is also applied to a control logic block 22.

The control logic block 22 receives as additional inputs an active low write enable ("/WE") and output enable ("/OE") signals as shown. The output of the control logic block 22 is applied as one input to an input/output ("I/O") latch and buffer 24. The I/O latch and buffer 24 also receives an external data signal on an I/O bus and presents data from the memory array 12 which is read therefrom in accordance with the row and column addresses maintained in the address latches 18, 20.

Figure 2:
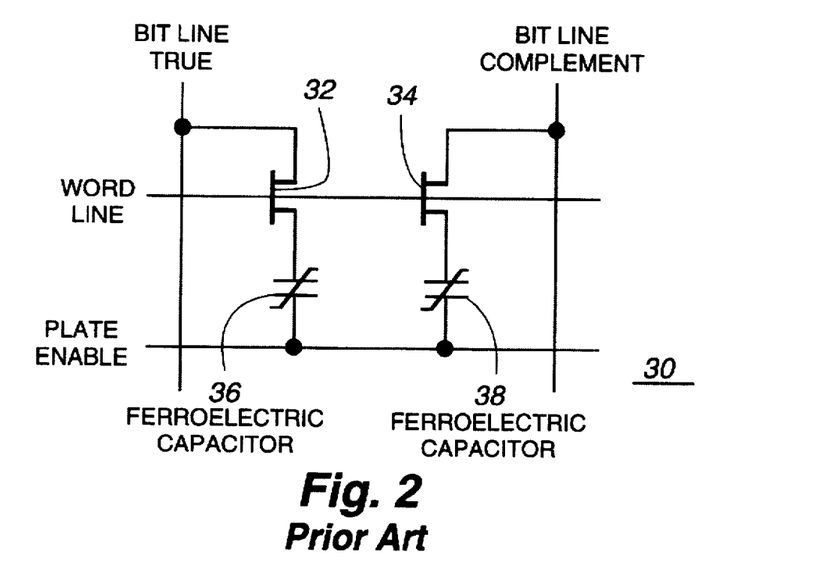
FIG. 2 is a schematic diagram of a conventional two transistor/two capacitor ("2T/2C") memory cell for use, for example, with the ferroelectric memory device of FIG. 1 and the succeeding FIG. 3, illustrating the differentially sensed Bit and /Bit lines for each such cell.

With reference additionally now to FIG. 2, a prior art 2 transistor/2 capacitor (2T/2C) memory cell 30 is shown which may be utilized, for example as a memory cell in the memory array 12 of FIG. 1. The memory cell 30 comprises, in pertinent part, a pair of pass transistors 32 and 34 coupled respectively in series with a capacitor 36 and a capacitor 38. The pass transistor 32 has one terminal thereof coupled to a "true" bit line and capacitor 36 has its remaining terminal coupled to a plate enable line. In like manner, the pass transistor 34 has one terminal thereof coupled to a complement bit line and capacitor 38 has its remaining terminal thereof also connected to the plate enable line. The control terminals of transistors 32 and 34 are coupled to the memory array word line.

In operation, each of the capacitors 36 and 38 are polarized in opposite directions. To "read" the state of the memory cell 30, both capacitors 36 and 38 are polarized in the same direction and the memory device sense amps measure the difference between the amount of charge transferred from the capacitors 36 and 38 to a pair the true and complement bit lines. In either case, since a "read" to a ferroelectric memory cell 30 is a destructive operation, the correct data is then restored to the cell during a precharge operation.

In a simple "write" operation, an electric field is applied to the memory cell 30 capacitor 36 and 38 to polarize them to the desired state. Briefly, the conventional write mechanism for the memory cell 30 includes inverting the dipoles on one cell capacitor (i.e. capacitor 32) and holding the electrode, or plate enable line, to a positive potential greater than the coercive voltage for a nominal 100 nanosecond ("nsec.") time period. The electrode is then brought back to circuit ground for the other cell capacitor (i.e. capacitor 34) to be written for an additional nominal 100 nsec.

The capacitors 36 and 38 may be conveniently furnished utilizing a ferroelectric dielectric such as the proprietary lead zirconate titanate ("PZT") developed by Ramtron International Corporation. Alternatively, strontium bismuth tantalate ("SBT") or other suitable ferroelectric dielectric may be utilized.

Figure 3:
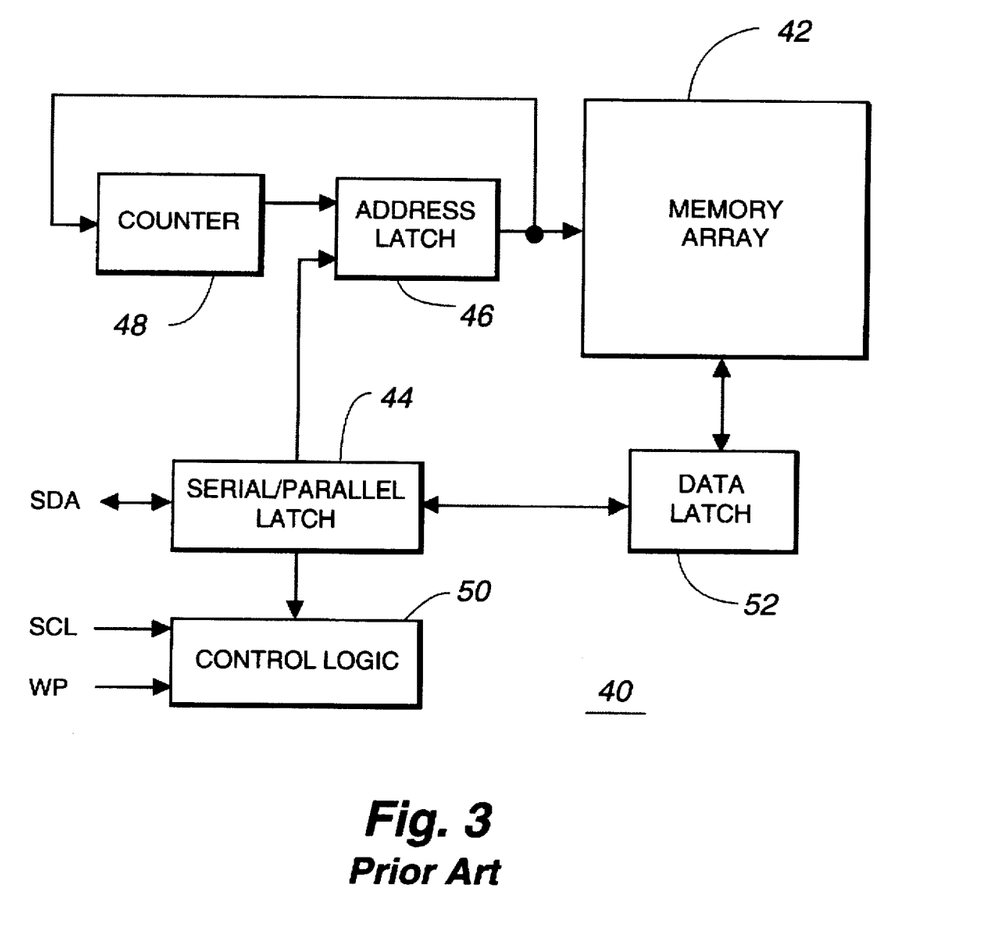
FIG. 3 is an additional simplified functional block diagram of a conventional serial ferroelectric memory device, such as the FM24C16, available from Ramtron International Corporation illustrating the serial data/address ("SDA") and serial clock ("SCL") inputs thereof.

With reference additionally now to FIG. 3, a prior art serial ferroelectric memory device 40 is shown. The memory device 40 comprises, in pertinent part, a memory array 42 having a number of memory cells which may also be in accordance with the exemplary memory cell 30 of FIG. 2. An externally accessible serial data address line ("SDA") is coupled to a serial/parallel latch 44 which provides a control signal to an address latch 46 having an output coupled to the memory array 42. The output of the address latch 46 is also coupled as one input to a counter 48 which provides an additional input to the address latch 46. The memory device 40 also includes externally accessible serial clock ("SCL") and write protect ("WP") inputs to a control logic block 50. The output of the serial/parallel latch 44 is bidirectionally coupled to a data latch 52 which, in turn, is bidirectionally coupled to the memory array 42.

Figure 4A:
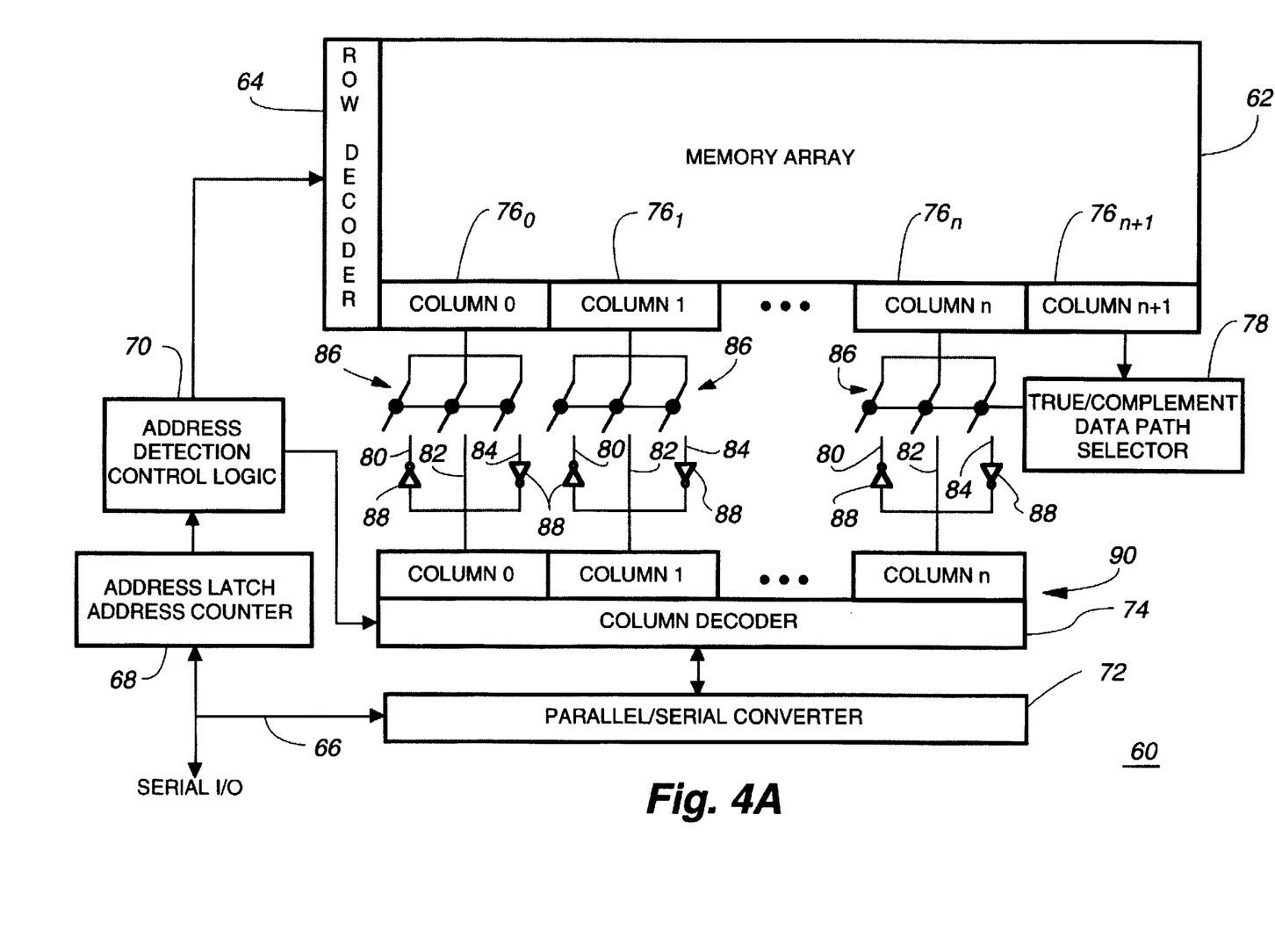
FIG. 4A is a simplified block diagram of a serial ferroelectric memory device incorporating, for example, a complementary data path and an additional column n+1 bit for implementing the system and method of the present invention for mitigating undesired imprint effects.

With reference additionally now to FIG. 4A, a serial memory device 60 in accordance with the present invention is shown. The serial memory device 60 comprises, in pertinent part, a memory array 62 of memory cells (which may be 2T/2C cells as shown in FIG. 2 or 1T/1C similar in configuration to standard volatile DRAM memory cells) which are accessible by means of addresses provided to a row decoder 64 and corresponding column decoder 74. Data is input to, and output from, the serial memory device 60 by means of a serial I/O bus 66 which is input to an address latch address counter 68 as well as a parallel/serial converter 72. The output of the address latch address counter 68 is provided as an input to the address detection control logic 70 which provides the row address signal to the row decoder 74 as well as the column address signal to the column decoder 74.

As can be seen, the serial memory device 60 includes a memory array 62 having column 0 through column N+1 cells thereof denominated $76_0$ through $76_{N+1}$ inclusive. The column N+1 cells $76_{N+1}$ of the memory array 62 are used to store a single bit indication, or indicator bit, of whether the data stored in the corresponding row is true or complement data and to control the functionality of a true/complement data path selector 78.

As can also be seen, each data line coupling the column decoder 74 to the respective columns $76_0$ through $76_N$ of the memory array 62 includes an inverted write data path 80, a true read/write data path 82 and an inverted read data path 84, selected ones of which may be enabled by means of a data bus switch 86 as controlled by the true/complement data path selector 78 in response to the setting of the bit in column N+1 cells $76_{N+1}$. The inverted write data path 80 and the inverted read data path 84 incorporate respective inverters 88 such that the logical sense of the data to be written to the memory array 62, or read therefrom, may be inverted as will be more fully described hereinafter. As will also be more fully described hereinafter, the column decoder 74 also incorporates an associated latch 90 comprising a number of columns 0 through N corresponding to columns $0(76_0)$ through N ($76_N$).

As will be more fully described hereinafter, the device 60 operation begins with either a read or write operation. The write operation may utilize a "write-through" technique (that is, write directly to the array 62 bypassing the latch 90) or write to the latch 90 and then to the array 62 at the row boundary or write cycle termination (in page mode). Conventional ferroelectric memory device 60 operation is "read-modify-write" for both operations which means that block writes (writes to several rows sequentially) will write back the data to the first column n times more than the last column (that is, column 0 gets one write with new data and n−1 write back cycles while column n gets n−1 write backs with old data and one write with new data). In addition, write-through requires full cycle operation for every byte when writing sequentially and writes via the latch 90 can have fast in-page access. Consequently, in a preferred embodiment, all accesses to the array 62 may be made via the latch 90.

The access sequence beginning with a write operation will detect the row address and load data into the latch 90 until the row boundary is reached or the write cycle is terminated. The latch is then written to the array 62 as true and the column n+1 bit is set. In the case of block writes, each byte (column) is written once.

Read operations begin with row address detect, the column n+1 bit is read and, if column n+1 is set (1), the true data path 82 is selected. On the other hand, if column n+1 is clear (0), the inverted data path 84 is selected and the latch 90 is loaded. In either event, the data at the output of the device 60 is as written to the user. After the latch 90 is loaded, data is written back to the array 62 inverted and the column n+1 bit is either set or cleared as appropriate. In an alternative embodiment, the n+1 column can be extended to three bits thereby allowing a simple voting scheme to correct single bit errors.

Figure 4B:
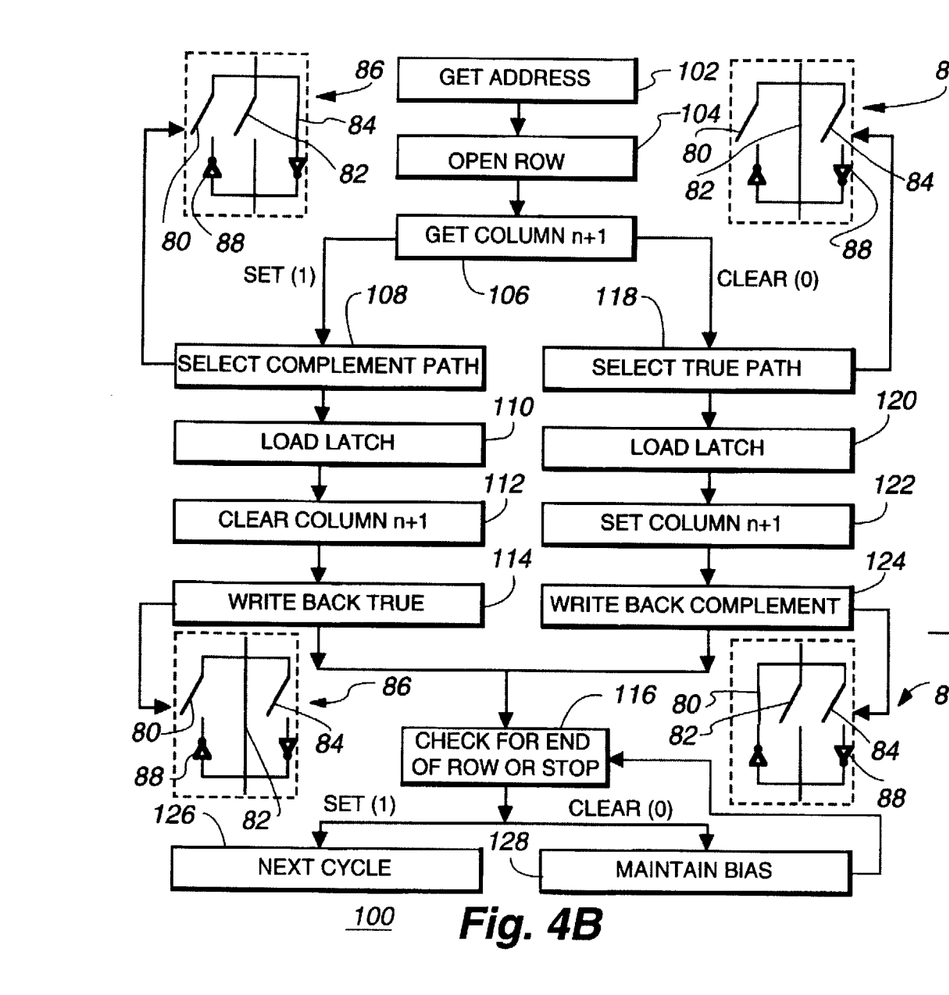
FIGS. 4B and 4C are a representative flowchart and corresponding logic function representation of a read cycle in conjunction with the serial ferroelectric memory device of FIG. 4A.
Figure 4C:
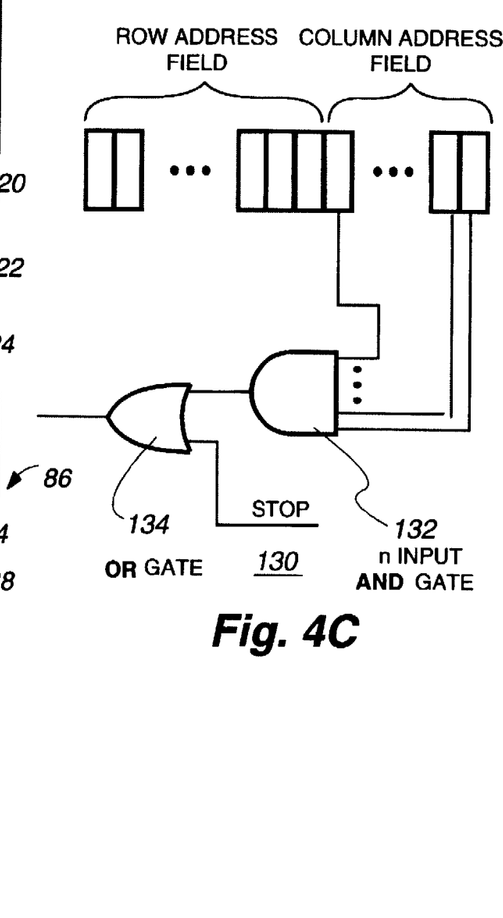

With reference additionally now to FIGS. 4B and 4C, an exemplary serial memory read cycle process flow 100 for use with the serial memory device 60 of FIG. 4A is shown. The process flow 100 comprises an initial step 102 in which the address supplied on the serial I/O bus 66 is received by the serial memory device 60. Thereafter, at step 104, the row portion of the address is utilized to open the corresponding row within the memory array 62. Thereafter, at step 106, the state of the data maintained in the column N+1 ($76_{N+1}$) of the memory array 62 is retrieved.

In the event the data maintained within column N+1 is a logic "1", then at step 108, the complement, or inverted read data path 84 is selected by means of the data path selector 86 as controlled by the true/complement data path selector 78. At step 110, the data is loaded into the latch 90 and the state of the column N+1 ($76_{N+1}$) bit is cleared at step 112. At step 114, the data is then written back to the memory array 62 by means of the true data path 82, as shown.

At step 116, the address is checked for the end of the corresponding row or a "stop" signal as is more fully shown in FIG. 4C. In this regard, the column address field is utilized as inputs to an N input logical AND gate 132 to supply one input to an OR gate 134. An additional input to the OR gate 134 is supplied as a "stop" signal as shown.

Alternatively, if the state of the data maintained in column N+1 ($76_{N+1}$) is a logic "0" then the true data path 82 is selected at step 118 and the latch 90 is loaded at step 120. Thereafter at step 122, the bit in the column N+1 ($76_{N+1}$)

position is set and the data is written back as complement data by the selection of the inverted write data path 80. At this point, the process 100 also proceeds to step 116, as previously described. Following step 116, if the bit maintained in column N+1 is a logic "1", the process proceeds to step 126 to begin the next address cycle. Alternatively, if the state of the bit in column N+1 ($76_{N+1}$) is a logic "0", then bias is continued to be maintained until the end of row or the "stop" signal is detected.

Figures 4D, 4E:
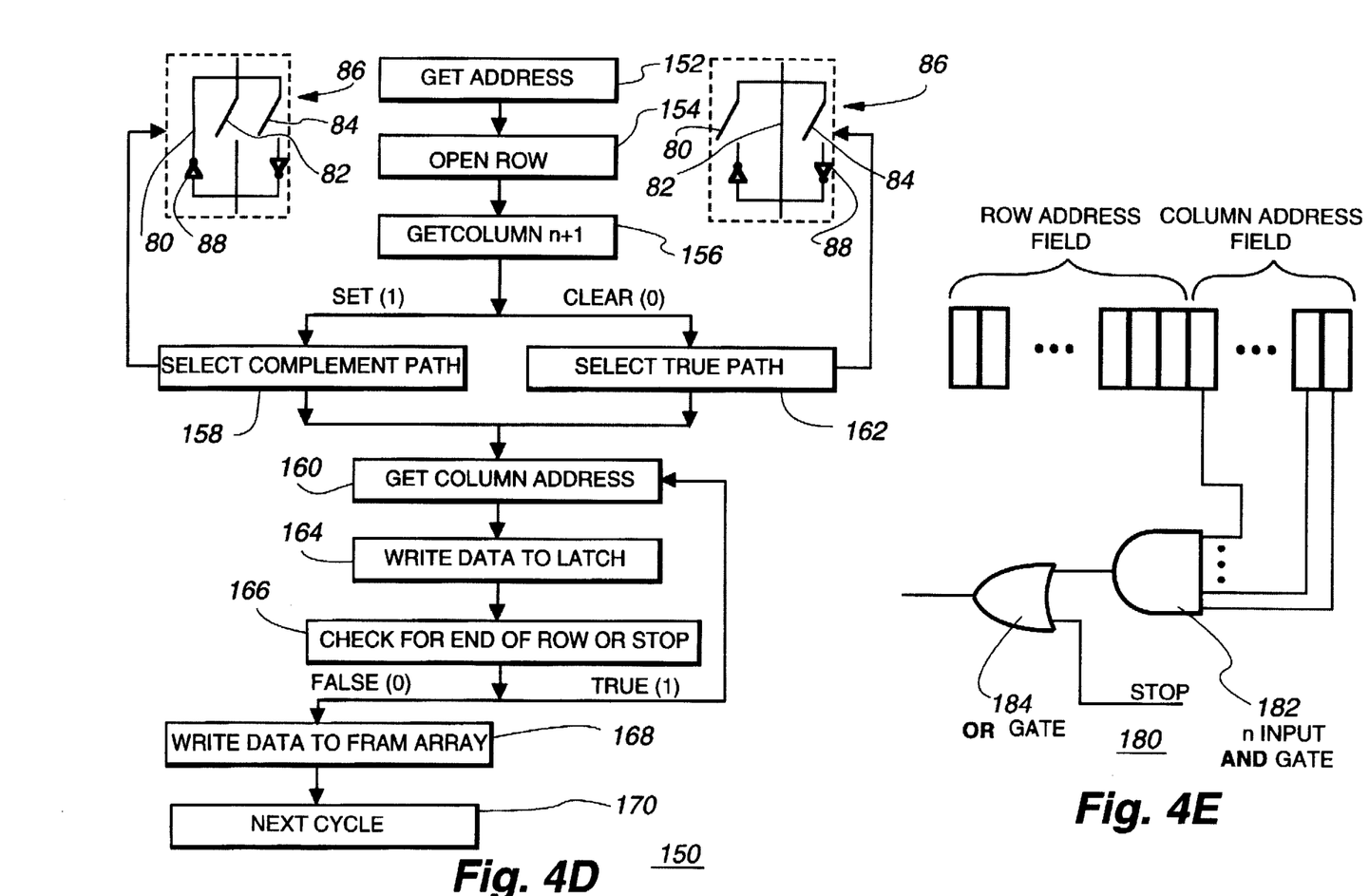
FIGS. 4D and 4E are a representative flowchart and corresponding logic function representation of a write cycle in conjunction with the serial ferroelectric memory device of FIG. 4A.

With reference additionally now to FIGS. 4D and 4E, an exemplary serial write cycle process 150 for the serial memory device 60 of FIG. 4A is shown. The process 150 begins at step 152 where the address applied to the serial memory device 60 is detected and, at step 154, the applicable row of the memory array 62 is opened at step 154. Thereafter, at step 156, the state of the bit maintained in column N+1 ($76_{N+1}$) is determined at step 156. If the state of the bit maintained in the column N+1 ($76_{N+1}$) is a logic "1", then the process 150 proceeds to step 158 where the complement, or inverted, write data path is selected. Alternatively, if the state of the bit in the column N+1 ($76_{N+1}$) is a logic "0", then the true data path 82 is selected at step 162.

Following either steps 158 or 162, the column address is determined at step 160 and the data is written to the latch 90 at step 164. Thereafter, at step 166, the end of row or "stop" signal is checked as shown in more detail in FIG. 4E. In this regard, the bits of the column address field are supplied as inputs to an N input logical AND gate 182 which provides an input signal to OR gate 184. OR gate 184 has as an additional input, a "stop" signal, as shown. If the bit maintained in the column N+1 ($76_{N+1}$) is a logic "0", then at step 168 the data is written to the memory array 62 and the process 150 proceeds to the next cycle at step 170. Alternatively however, if the bit maintained in column N+1 ($76_{N+1}$) is a logic "1", then the process 150 returns to step 160 to get the column address.

Serial memory devices, such as the device 60 of FIG. 4A, may also allow for extended plate bias on read cycles because the write-back occurs at the beginning of the cycle and data is often read in blocks. If the bias is not terminated until a row boundary occurs, then the capacitors of the memory cells can remain at bias for at least the length of time it takes to read a single row. This additional time at bias also serves to mitigate the effects of imprint.

Figure 5A:
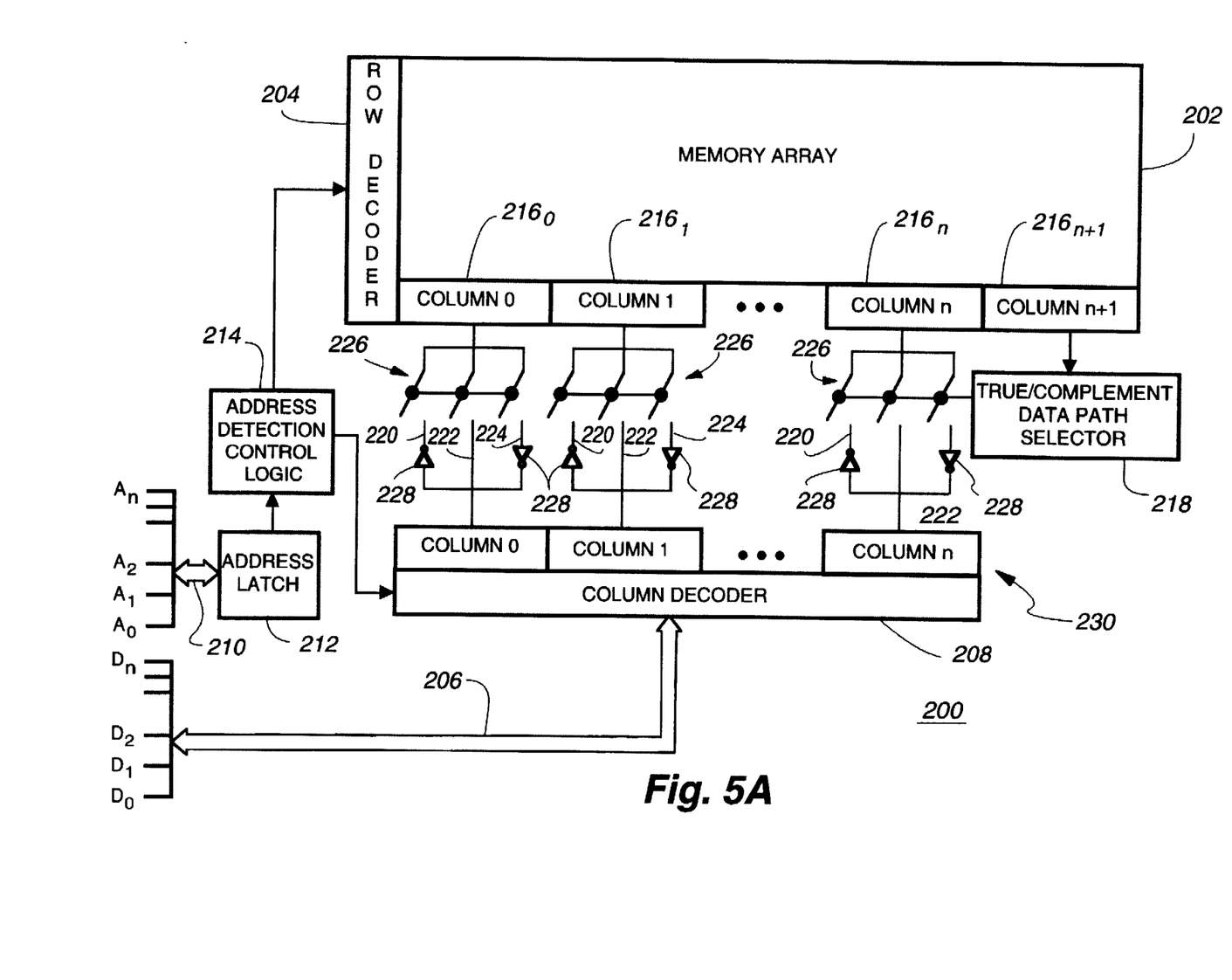
FIG. 5A is a simplified block diagram of a parallel ferroelectric memory device also incorporating, for example, a complementary data path and an additional column n+1 bit for implementing the system and method of the present invention for mitigating undesired imprint effects.

With reference additionally now to FIG. 5A, a parallel memory device 200 in accordance with the present invention is shown. The memory device 200 comprises, in pertinent part, a memory array 202 which contains a number of memory cells arranged in rows and columns which are accessible by means of a corresponding row decoder 204 and column decoder 208. A bidirectional data bus 206 comprising data lines $D_0$ through $D_N$ provide data which is to be written to the memory array 202 or externally supplies data which has been read from the memory array 202. An address bus comprising lines $A_0$ through $A_N$ 210 is coupled to an address latch 212 which, in turn, supplies an input to an address detection control logic block 214. An output of the address detection control logic block 214 is supplied to the column decoder 208 as well as to the row decoder 204 to provide respective column and row addresses for the memory array 202.

The memory array 202 is arranged such that there are again columns 0 through N+1 ($216_0$ through $216_{N+1}$). The bit maintained in the column N+1 ($216_{N+1}$) location of each row within the memory array 202 supplies an input to a true/complement data path selector 218.

The true/complement data path selector 218 allows for data to be written to (or read from) the memory array 202 through an inverted write data path 220, a true read/write data path 222 or an inverted read data path 224 as controlled by a data bus switch 226. The inverted write data path 220 and inverted read data path 224 each incorporate a respective inverter 228 to effectuate the logic inversion function. As shown, the column decoder 208 has associated therewith an N bit latch 230 corresponding to columns 0 through column N ($216_0$ through $216_N$) respectively.

Figure 5B:
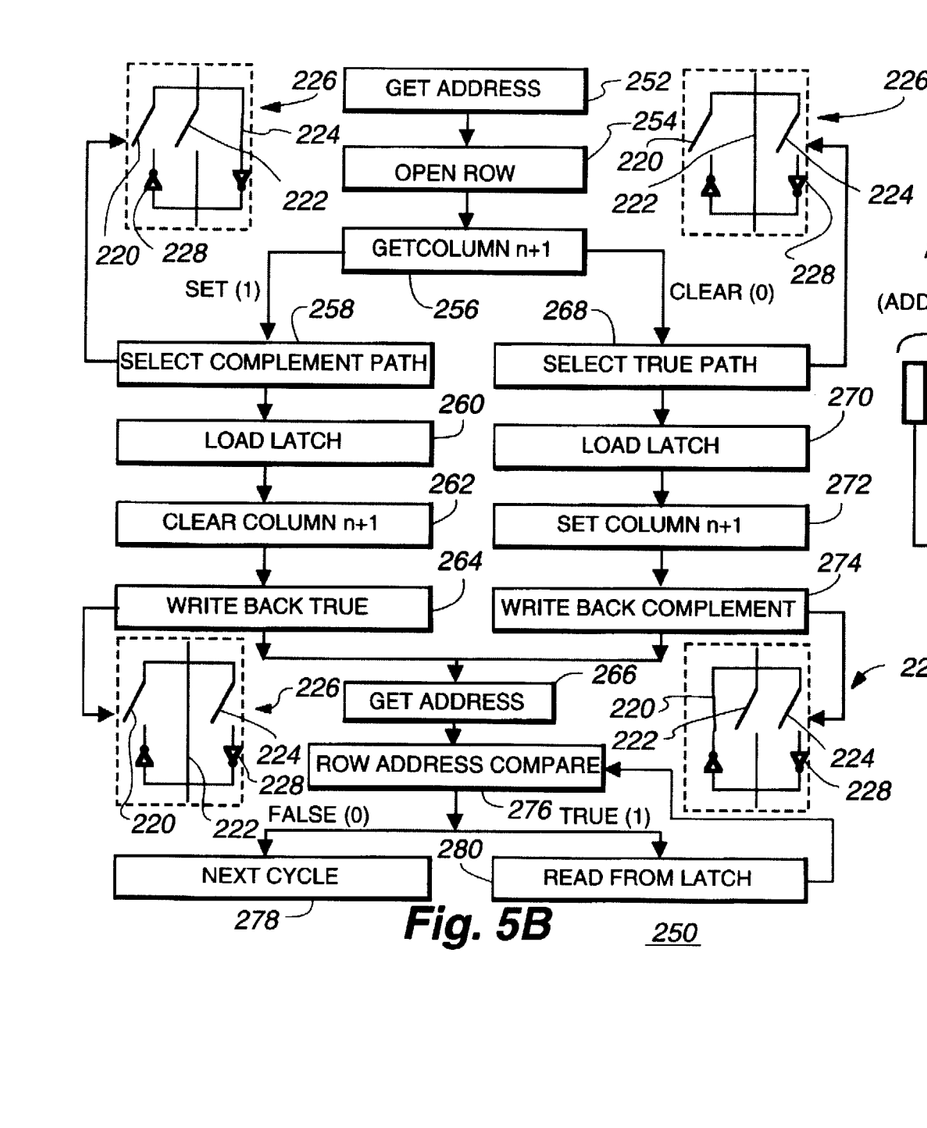
FIGS. 5B and 5C are a representative flowchart and corresponding logic function representation of a read cycle in conjunction with the parallel ferroelectric memory device of FIG. 5A.
Figure 5C:
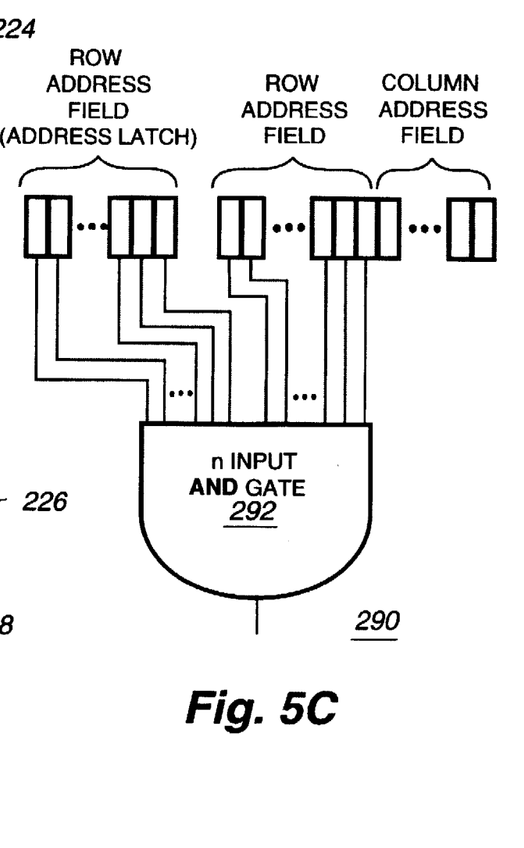

With reference additionally now to FIGS. 5B and 5C, an exemplary parallel memory read cycle process 250 for use in conjunction with the parallel memory device 200 of FIGS. 5A is shown. The process 250 begins at step 252 where the address is retrieved from the external address bus 210 by means of the address latch 212 and address detection control logic 214. Thereafter, at step 254, the desired row represented by the address is opened and, at step 256, the bit maintained in column N+1 ($216_{N+1}$) is retrieved. If the bit maintained in column N+1 ($216_{N+1}$) is a logic "1", then at step 258, the complement, or inverted, read data path 224 is selected. The data is then loaded into the latch 230 at step 260 and the bit in the column N+1 ($216_{N+1}$) location is cleared at step 262. Thereafter, at step 264, a write-back true operation is effectuated by means of the true write/read data path 222 and the process 250 then proceeds to step 266.

Alternatively, if at step 256, the bit maintained in column N+1 ($216_{N+1}$) is a logic "0", then the process 250 proceeds to step 268 where the true write/read data path 222 is selected. The latch 230 is then loaded at step 270 and the bit in column N+1 ($216_{N+1}$) is set at step 272. The complement data is then written back to the array at step 274 by selecting the inverted write data path 220.

From either steps 264 or 274, the process 250 proceeds to step 266 to get the address from the external address bus 210 and to then perform a row address comparison at step 276. If the row address compare operation results in a logic "0", then the process proceeds to step 278 to begin the next cycle. Alternatively, if the row address compare operation at step 276 produces a logic "1", then the data is read from the latch 230 and the process 250 returns to step 276 until that operation is completed.

With particular reference to FIG. 5C, it can be seen that the row address comparison of step 276 may be effectuated by means of a circuit 290 comprising an N input AND gate 292. The AND gate 292 may have as inputs the bits maintained in the address latch 212 corresponding to the row address field, as well as the bits in the row address field itself. The bits in the column address field may be ignored.

Figures 5D, 5E:
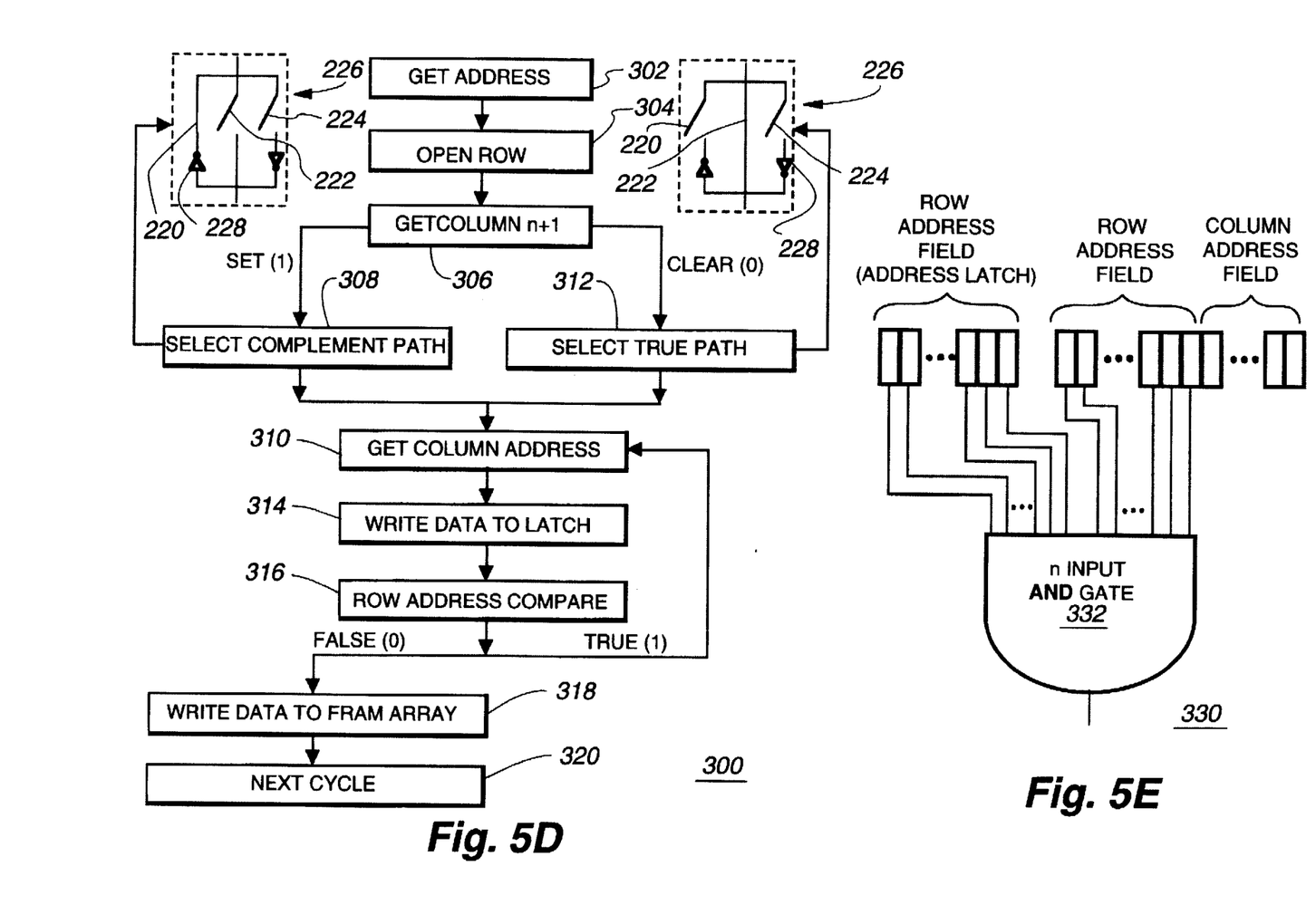
FIGS. 5D and 5E are a representative flowchart and corresponding logic function representation of a write cycle in conjunction with the serial ferroelectric memory device of FIG. 5A.

With reference additionally now to FIGS. 5D and 5E, an exemplary parallel memory write cycle process 300 is shown for use with the parallel memory device 200 of FIG. 5A. The process 300 begins at step 302 where the address is retrieved from the address bus 210 as maintained in the address latch 212. At step 304, the designated row maintained within the address latch and the address detection control logic block 214 is opened. Thereafter, the bit maintained in the column N+1 ($216_{N+1}$) is retrieved at step 306. If the bit is a logic "1", then at step 308, the complement path is selected by enabling the inverted write data path 220. Thereafter, the process 300 proceeds to step 310. Alternatively, if the bit in column N+1 ($216_{N+1}$) is a logic "0", then at step 312, the true write/read data path 222 is selected and the process 300 proceeds to step 310 to get the column address from the address latch 212 and address detection control logic 214.

At step 314, the data on the data bus 206 is written to the latch 230 and a row address compare step 316 is undertaken. If the row address compare step 316 indicates a logic "0", then the data is written to the memory array 202 at step 318 and the next cycle is begun at step 320. Alternatively, if the row address compare step 316 results in a logic "1", then the process 300 returns to step 310.

With particular reference to FIG. 5E, the row address compare step 316 is shown in the form of a circuit 330 comprising an N input AND gate 332. The N input AND gate 332 has as inputs, the row address field maintained within the address latch 212, as well as the bits in the row address field. The bits in the column address field may be ignored.

In the aforedescribed implementations, it should be noted that the single N+1 true/complement bit location may be alternatively replaced with multiple bit locations. For example, when used in conjunction with an 8 bit wide memory array, three bits ($2^3$) in the N+1 column may then be utilized to provide error correction capabilities as well as previously noted.

While there have been described above the principles of the present invention in conjunction with specific ferroelectric integrated circuit memory devices, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A memory device comprising an array of memory cells, each of said memory cells being capable of being written with data in the form of a data bit having one of two opposite states thereof and each of said memory cells being further accessible for reading a written data bit therefrom as one of said two opposite states thereof, said memory device comprising:

a true data path coupling an external data path to said memory array for writing a first group of user data bits to said memory cells and reading said written first group of user data bits from said memory cells in an unaltered state thereof;

a complement write data path coupling said external data path to said memory array for writing a second group of user data bits to said memory cells in an opposite state thereof; and a complement read data path coupling said memory array to said external data path for reading said written second group of user data bits from said memory cells in an opposite state thereof.

2. The memory device of claim 1 wherein said memory cells comprise at least one capacitor having a ferroelectric dielectric and an associated pass transistor.

3. The memory device of claim 2 wherein said ferroelectric dielectric comprises lead zirconate titanate.

4. The memory device of claim 2 wherein said ferroelectric dielectric comprises strontium bismuth tantalate.

5. The memory device of claim 2 wherein said memory cell comprises a pair of complementary capacitors each having an associated pass transistor.

6. The memory device of claim 1 wherein said complement write data path and said read data path incorporate an inverter for inverting a data bit from one to another of said two opposite states thereof.

7. The memory device of claim 1 further comprising an additional column in said array of memory cells comprising at least one bit location corresponding to each row in said array of memory cells.

8. The memory device of claim 7 wherein at least one bit maintained in said at least one bit location of said additional column in said array of memory cells is indicative of true or complement data being stored in said row corresponding thereto.

9. The memory array of claim 8 further comprising a true complement data path selector responsive to said at least one bit maintained in said at least one bit location of said additional column in said array of memory cells for selecting one of said true, complement write and complement read data paths.

10. A method for writing data bits each having one of two opposite states thereof to a memory array wherein each cell of said memory array is capable of being written with data in the form of a data bit having one of said two opposite states, said method comprising the steps of:

receiving a group of user data bits on an external data path;

inverting a state of each of said user data bits; and storing each of said inverted user data bits in a respective cell of said memory array.

11. The method of claim 10 further comprising the steps of:

reinverting said state of said stored inverted user data bits; and placing said reinverted, stored inverted user data bits on said external data path.

12. The method of claim 10 further comprising the steps of:

selectively writing said user data bits to said memory array in an uninverted state;

selectively reading said stored uninverted user data bits from said memory array; and alternatively placing said uninverted user data bits on said external data path.

13. The method of claim 11 wherein said steps of inverting and reinverting are dependent on the state of at least one indicator bit stored in said memory array.

14. The method of claim 13 further comprising the step of:

providing at least one bit location in said memory array for storing said at least one indicator bit.

15. The method of claim 10 wherein said step of receiving is carried out by a parallel external data path.

16. The method of claim 10 wherein said step of receiving is carried out by a serial external data path.

17. The method of claim 10 wherein said step of storing is carried out by a plurality of non-volatile memory cells corresponding to said user data bits.

18. The method of claim 10 wherein said step of inverting is carried out by means of a complement write data path coupling said external data path to said memory array.

19. The method of claim 11 wherein said step of reinverting is carried out by means of a complement read data path coupling said memory array to said external data path.

20. A method for writing a data word to a memory array of a memory device wherein each cell of said memory array is capable of being written with data in the form of a data bit having one of two opposite states, said method comprising the steps of:

providing at least one true/complement indicator bit in said memory array;

inputting a plurality of data bits representative of said data word to at least one data input to said memory device;

storing said plurality of data bits in said memory array if said indicator bit is in a first state thereof;

inverting each of said data bits to an opposite state thereof if said indicator bit is in a second state thereof; and alternatively storing said inverted data bits in said memory array.

21. The method of claim 20 further comprising the steps of:

retrieving said plurality of stored data bits from said memory array;

outputting said plurality of stored data bits to at least one data output of said memory device if said indicator bit is in a first state thereof;

also inverting each of said plurality of stored data bits if said indicator bit is in said second state thereof; and alternatively outputting said plurality of stored data bits to said at least one data output.

22. The method of claim 20 wherein said step of inputting is carried out by means of a parallel data path.

23. The method of claim 20 wherein said step of inputting is carried out by means of a serial data path.

24. The method of claim 20 wherein said steps of storing and alternatively storing are carried out by means of a plurality of non-volatile memory cells corresponding to each of said plurality of data bits.

25. The method of claim 20 wherein said step of inverting is carried out by means of a complement write data path.

26. The method of claim 21 wherein said step of also inverting is carried out by means of a complement read data path.

27. A memory device comprising:

a memory array including a plurality of memory cells, each of said memory cells capable of being written with data in the form of a data bit having one of two opposite states, said memory cells being arranged in a plurality of rows and columns, each of said rows including at least one indicator bit location;

a row decoder coupled to said memory array for selectively accessing a selected one of said plurality of rows;

a column decoder for selectively accessing a selected one of said plurality of columns, said column decoder being selectively couplable to said memory array through a true data path and at least one complementary data path; and a true/complement data path selector responsive to said at least one indicator bit corresponding to said selected one of said rows for selectively enabling either said true data path or said at least one complementary data path.

28. The memory device of claim 27 wherein said memory cells comprise at least one capacitor having a ferroelectric dielectric and an associated pass transistor.

29. The memory device of claim 28 wherein said ferroelectric dielectric comprises lead zirconate titanate.

30. The memory device of claim 28 wherein said ferroelectric dielectric comprises strontium bismuth tantalate.

31. The memory device of claim 28 wherein said memory cell comprises a pair of complementary capacitors each having an associated pass transistor.

32. The memory device of claim 27 wherein said at least one complementary data path comprises a complementary write data path and a complementary read data path.

* * * * *